(12) United States Patent
Beardslee et al.

(10) Patent No.: US 9,553,223 B2
(45) Date of Patent: Jan. 24, 2017

(54) METHOD FOR ALIGNMENT OF MICROWIRES

(71) Applicant: California Institute of Technology, Pasadena, CA (US)

(72) Inventors: Joseph A. Beardslee, Los Angeles, CA (US); Nathan S. Lewis, La Canada Flintridge, CA (US); Bryce Sadtler, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 366 days.

(21) Appl. No.: 14/163,745

(22) Filed: Jan. 24, 2014

(65) Prior Publication Data
US 2014/0201980 A1    Jul. 24, 2014

Related U.S. Application Data

(60) Provisional application No. 61/756,381, filed on Jan. 24, 2013.

(51) Int. Cl.
*H01L 31/0352* (2006.01)
*H01F 41/26* (2006.01)

(52) U.S. Cl.
CPC ........... *H01L 31/0352* (2013.01); *H01F 41/26* (2013.01); *Y10T 29/4902* (2015.01)

(58) Field of Classification Search
CPC ...... A61L 27/30; A61L 27/54; A61L 2300/43; A61L 2300/624; A61L 2400/12; H01F 41/26; Y10T 29/4905; H01L 31/0352
See application file for complete search history.

(56) References Cited

U.S. PATENT DOCUMENTS

| 4,358,676 | A | 11/1982 | Childs et al. |
| 5,314,569 | A | 5/1994 | Pribat |
| 5,336,558 | A | 8/1994 | Debe |
| 5,352,651 | A | 10/1994 | Debe |
| 5,976,957 | A | 11/1999 | Westwater et al. |
| 6,306,734 | B1 | 10/2001 | Givargizov |
| 6,518,494 | B1 | 2/2003 | Shibuya et al. |
| 6,649,824 | B1 | 11/2003 | Den |

(Continued)

FOREIGN PATENT DOCUMENTS

| CN | 1669920 A | 9/2005 |
| CN | 1676568 A | 10/2005 |

(Continued)

OTHER PUBLICATIONS

Wagner et al., "The Vapor-Liquid-Solid Mechanism of Crystal Growth and Its Application to Silicon", Trans. Metal. Soc. AIME, 1965, 233 (6), 1053-1064.

(Continued)

*Primary Examiner* — Carl Arbes
(74) *Attorney, Agent, or Firm* — Joseph R. Baker, Jr.; Gavrilovich Dodd & Lindsey LLP

(57) ABSTRACT

A method of aligning microwires includes modifying the microwires so they are more responsive to a magnetic field. The method also includes using a magnetic field so as to magnetically align the microwires. The method can further include capturing the microwires in a solid support structure that retains the longitudinal alignment of the microwires when the magnetic field is not applied to the microwires.

18 Claims, 8 Drawing Sheets

(56) References Cited

U.S. PATENT DOCUMENTS

| | | | |
|---|---|---|---|
| 6,720,459 B2 | 4/2004 | Sunkara et al. | |
| 6,902,807 B1* | 6/2005 | Argoitia | B41M 3/148 |
| | | | 106/31.13 |
| 7,057,881 B2 | 6/2006 | Chow et al. | |
| 7,105,428 B2 | 9/2006 | Pan et al. | |
| 7,109,517 B2 | 9/2006 | Zaidi | |
| 7,116,546 B2 | 10/2006 | Chew | |
| 7,148,417 B1 | 12/2006 | Landis | |
| 7,238,594 B2 | 7/2007 | Fonash et al. | |
| 7,253,017 B1 | 8/2007 | Roscheisen et al. | |
| 7,253,442 B2 | 8/2007 | Huang | |
| 7,259,324 B2 | 8/2007 | Zeira | |
| 7,309,620 B2 | 12/2007 | Fonash et al. | |
| 7,335,259 B2 | 2/2008 | Hanrath et al. | |
| 7,521,274 B2 | 4/2009 | Hersee et al. | |
| 7,560,366 B1 | 7/2009 | Romano et al. | |
| 7,592,255 B2 | 9/2009 | Kuekes et al. | |
| 7,666,708 B2 | 2/2010 | Lieber et al. | |
| 7,818,816 B1 | 10/2010 | Reppert et al. | |
| 7,820,064 B2 | 10/2010 | Jin | |
| 7,932,106 B2 | 4/2011 | Li | |
| 7,998,788 B2 | 8/2011 | Guba et al. | |
| 9,149,564 B2* | 10/2015 | Jin | A61L 27/30 |
| 2002/0172820 A1 | 11/2002 | Majumdar et al. | |
| 2004/0213307 A1 | 10/2004 | Lieber et al. | |
| 2005/0098204 A1 | 5/2005 | Roscheisen et al. | |
| 2005/0167647 A1 | 8/2005 | Huang et al. | |
| 2005/0227391 A1 | 10/2005 | Jin et al. | |
| 2005/0253138 A1 | 11/2005 | Choi et al. | |
| 2005/0279274 A1 | 12/2005 | Niu et al. | |
| 2006/0118791 A1 | 6/2006 | Leu | |
| 2006/0207647 A1 | 9/2006 | Tsakalakos et al. | |
| 2007/0032076 A1 | 2/2007 | Lee et al. | |
| 2007/0099008 A1 | 5/2007 | Shimizu et al. | |
| 2007/0122313 A1 | 5/2007 | Li et al. | |
| 2007/0157964 A1 | 7/2007 | Gronet | |
| 2007/0166899 A1 | 7/2007 | Yao et al. | |
| 2007/0232028 A1 | 10/2007 | Lee et al. | |
| 2007/0278476 A1 | 12/2007 | Black | |
| 2008/0006319 A1 | 1/2008 | Bettge et al. | |
| 2008/0041439 A1 | 2/2008 | Achutharaman et al. | |
| 2008/0047604 A1 | 2/2008 | Korevaar et al. | |
| 2008/0072961 A1 | 3/2008 | Liang et al. | |
| 2008/0075954 A1 | 3/2008 | Wardle et al. | |
| 2008/0093698 A1 | 4/2008 | Tsakalakos et al. | |
| 2008/0110486 A1 | 5/2008 | Tsakalakos et al. | |
| 2008/0135089 A1 | 6/2008 | Tsakalakos et al. | |
| 2008/0169017 A1 | 7/2008 | Korevaar et al. | |
| 2008/0276987 A1 | 11/2008 | Flood | |
| 2008/0315430 A1 | 12/2008 | Weber et al. | |
| 2009/0020150 A1 | 1/2009 | Atwater et al. | |
| 2009/0020853 A1 | 1/2009 | Kayes et al. | |
| 2009/0050204 A1 | 2/2009 | Habib | |
| 2009/0057839 A1 | 3/2009 | Lewis et al. | |
| 2009/0078303 A1 | 3/2009 | Brezoczky et al. | |
| 2009/0127540 A1 | 5/2009 | Taylor | |
| 2009/0152527 A1 | 6/2009 | Lee et al. | |
| 2009/0165844 A1 | 7/2009 | Dutta | |
| 2009/0165849 A1 | 7/2009 | Chan et al. | |
| 2009/0266411 A1 | 10/2009 | Habib et al. | |
| 2010/0108131 A1 | 5/2010 | Guha et al. | |
| 2010/0175748 A1 | 7/2010 | Karg | |
| 2010/0303722 A1* | 12/2010 | Jin | A61L 27/30 |
| | | | 424/9.1 |
| 2011/0096218 A1 | 4/2011 | Bratkovski et al. | |
| 2012/0031486 A1 | 2/2012 | Parce et al. | |

FOREIGN PATENT DOCUMENTS

| | | |
|---|---|---|
| CN | 1808688 A | 7/2006 |
| JP | 6-508678 | 9/1994 |
| JP | 11-214720 | 8/1999 |
| JP | 2000-269561 | 9/2000 |
| JP | 2001-135516 | 5/2001 |
| JP | 2004-152787 | 5/2004 |
| JP | 2005-310388 | 4/2005 |
| JP | 2005-194609 | 7/2005 |
| JP | 2005-111200 | 10/2005 |
| JP | 2005-303301 | 10/2005 |
| JP | 2005-310821 | 11/2005 |
| JP | 2006-128233 | 5/2006 |
| JP | 2007-091485 | 4/2007 |
| JP | 2007-126311 | 5/2007 |
| JP | 2009-537339 A | 10/2009 |
| KR | 10-2007-18457 | 2/2007 |
| KR | 10-2008-0044181 A | 5/2008 |
| WO | 93/00560 | 1/1993 |
| WO | 03/005450 A2 | 1/2003 |
| WO | 2006/138671 A2 | 12/2006 |
| WO | 2008/054541 A2 | 5/2008 |
| WO | 2008/135905 A2 | 11/2008 |
| WO | 2009/012459 A2 | 1/2009 |
| WO | 2009/032412 A1 | 3/2009 |
| WO | WO2009032412 A1 | 3/2009 |

OTHER PUBLICATIONS

Wagner et al., "Defects in Silicon Crystals Grown by the VLS Technique", J. of Applied Physics, vol. 38, No. 4, 1967, 1554-1560.
Wang et al., "Titania-nanotube-array-based photovoltaic cells", Appl. Phys. Lett, 89, 023508 (3 pages), 2006.
Westwater et al., "Control of the Size and Position of Silicon Nanowires Grown via the Vapor-Liquid-Solid Technique", Jpn. J. Appl. Phys., vol. 36 (1997) pp. 6204-6209.
Westwater et al., "Si Nanowires Grown via the Vapour-Liquid-Solid Reaction", Phys. Stat. Sol. (a) 165, 37-42 (1998).
Wolf et al., "Limitations and Possibilities for Improvement of Photovoltaic Solar Energy Converters* Part I: Considerations for Earth's Surface Operations", Proceedings of IRE, 1960, 48:1246-1263.
Wolfbauer, Georg, Communication Pursuant to Rule 70(2) and 70a(2) EPC, European Patent Application No. 08782075.9, Oct. 18, 2011.
Wolfbauer, Georg, Communication Pursuant to Article 94(3) EPC, European Patent Application No. 08782075.9, Mar. 5, 2014.
Woodruff et al., "Vertically Oriented Germanium Nanowires Grown from Gold Colloids on Silicon Substrates and Subsequent Gold Removal", Nano Letters, 2007, vol. 7, No. 6, 1637-1642.
Wu et al., "A Study on Deep Etching of Silicon Using Ethylene-Diamine-Pyrocatechol-Water", Sensors and Actuators, 9 (1986) 333-343.
Wu et al., "Semiconductor nanowire array: potential substrates for photocatalysis and photovoltaics", Topics in Catal., 2002, 19 (2), 197-202.
Xia et al., "One-Dimensional Nanostructures: Synthesis, Characterization, and Applications", Adv. Mater., 2003, 15(5), 353-389.
Yablonovitch, E. et al., "Statistical ray optics", Journal of the Optical Society of America, 1982, 72:899-907.
Yablonovitch, E. et al., "Unusually low surface-recombination velocity on silicon and germanium surfaces", Physical Review Letters, 1986, 57:249-252.
Yang et al., "Experimental Observation of an Extremely Dark Material by a Low-Density Nanotube Array", Nano Letters, 2008, vol. 8, No. 2, 446-451.
Yao et al., "Si nanowires synthesized with Cu catalyst", Materials Letters, 61 (2007), pp. 177-181.
Yoon et al., "Minority Carrier Lifetime and Radiation Damage Coefficients of Germanium", Conference Record of the Thirty-First IEEE, Photovoltaic Specialists Conference, Jan. 3-7, 2005, pp. 842-845.
Yoon et al., "Ultrathin silicon solar microcells for semitransparent, mechanically flexible and microconcentrator module designs", Nat. Mater., 2008, 7:907-915.
Yu et al., "Silicon Nanowires: Preparation, Device Fabrication, and Transport Properties", J. Phys. Chem. B 2000, 104, 11864-11870.
Yu et al., "Large-area blown bubble films of aligned nanowires and carbon nanotubes", Nat. Nanotechnol., 2007, 2 (6) 372-377.

(56) References Cited

OTHER PUBLICATIONS

Zach et al., "Synthesis of Molybdenum Nanowires with Millimeter-Scale Lengths Using Electrochemical Step Edge Decoration", Chem. Mater. 2002, 14, 3206-3216.

Zhu et al., "Optical Absorption Enhancement in Amorphous Silicon Nanowire and Nanocone Arrays", Nano Letters, 2009, vol. 9, No. 1, 279-282.

Office Action issued in Japanese Patent Application No. 2010-522999, Mar. 5, 2013.

Office Action issued in Chinese Patent Application No. 200880107746.5, Sep. 27, 2011.

Office Action issued in Chinese Patent Application No. 20080102837.X, Oct. 9, 2011.

Altermatt, P. et al., "Simulation of optical properties of Si wire cells", 34th IEEE Photovoltaic Specialists Conference, 2009, 000972-000977.

Amra, C., "From light scattering to the microstructure of thin-film multilayers", Applied Optics, vol. 32, No. 28, p. 5481 (1993).

Anandan et al., "Room temperature growth of CuO nanorod arrays on copper and their application as a cathode in dye-sensitized solar cells", Materials Chemistry and Physics, 93 (2005), 35-40.

Anandan, Sambandam, "Recent improvements and arising challenges in dye-sensitized solar cells", Solar Energy Materials & Solar Cells, 91 (2007) 843-846.

Aspenes, D.E., "Optical functions of intrinsic c-Si for photon energies up to 7.5 eV: table", Properties of Crystalline Silicon, 1999, 683-690.

Baharlou, Simin, International Preliminary Report on Patentability issued in PCT/US2011/029663, The International Bureau of WIPO, Date of Mailing: Oct. 4, 2012.

Bai, Lingfei, International Preliminary Report on Patentability, PCT/US2010/058314, The International Bureau of WIPO, Jun. 14, 2012.

Balakrisnan et al., "Patterning PDMS using a combination of wet and dry etching", J. Micromech. Microeng., 19 (2009) 047002.1-047002.7.

Basol et al., "Ultra-Thin Electrodeposited CdS/CdTe Heterojunction with 8% Efficiency", IEEE Photo. Spec. Conf., 1982, 805-808.

Basol, B., "High-efficiency electroplated heterojunction solar cell", J. Appl. Phys. 55(2), 1984, pp. 601-603.

Basol, B., "Thin Film CdTe Solar Cells—A Review", Conf. Rec. IEEE Photo. Spec. Conf., 1990, 588-594.

Bhattacharya et al., "Electrodeposition of CdTe Thin Films", 1984, 131, 2032-2041.

Bierman et al., "Potential applications of hierchical branching nanowires in solar energy", Energy Environ. Sci., 2009, 1050-1059.

Boettcher, Shannon W. et al., "Energy-Conversion Properties of Vapor-Liquid-Solid-Grown Silicon Wire-Array Photocathodes", Science, 2010, 327:185-187.

Bogart et al., "Diameter-Controlled Synthesis of Silicon Nanowires Using Nanoporous Alumina Membranes", Adv. Mater. 2005, 17 (1), 114-117.

Brown et al., "Impurity photovoltaic effect: Fundamental energy conversion efficiency limits", Journal of Applied Physics, vol. 92, No. 3, 2002, 1329-1336.

Bullis, W.M., "Properties of Gold in Silicon", Solid-State Electronics, Pergamon Press, 1966, vol. 9, pp. 143-168.

Campbell et al., "The Limiting Efficiency of Silicon Solar Cells under Concentrated Sunlight", IEEE Transactions on Electron Devices, vol. ED-33, No. 2, 1986, 234-239.

Choi, Jeong Yoon, Search Report for PCT/US2008/070509, Korean Intellectual Property Office, Date of Mailing: Feb. 20, 2009.

Choi, Jeong Yoon, Written Opinion for PCT/US2008/070509, Korean Intellectual Property Office, Date of Mailing: Feb. 20, 2009.

Chu et al., "Large Area Polycrystalline Silicon Solar Cells on Unidirectionally Solidified Acid-Treated Metallurigcal Grade Silicon", Proc. IEEE Southeastcon, 1989, 1436-1441.

Colombo et al., "Gallium arsenide p-i-n radial structures for photovoltaic applications", Applied Physics Letters, 94, 2009, 173108-1-173108-3.

Davis, Jr. et al., "Impurities in Silicon Solar Cells", IEEE Transactions on Electron Devices, vol. ED-27, No. 4, Apr. 1980, 677.

de Dood, Michiel Jacob Andries, "Silicon photonic crystals and spontaneous emission", Thesis, Utrecht University, 2002.

Dong et al., "Coaxial Group III—Nitride Nanowire Photovoltaics", Nano Letters, 2009, vol. 9, No. 5, 2183-2187.

Erts et al., "High Density Germanium Nanowire Assemblies: Contact Challenges and Electrical Characterization", J. Phys. Chem. B2006, 110, 820-826.

Fan et al., "Semiconductor Nanowires: From Self-Organization to Patterned Growth", Small 2(6), 700-717 (2006).

Fan et al., "Well-ordered ZnO nanowire arrays on GaN substrate fabricated via nanosphere lithography", Journal of Crystal Growth, 287 (2006) 34-38.

Fan et al., "Three-dimensional nanonpillar-array photovoltaics on low-cost and flexible substrates", Nature Mater., 2009, 8:648-653.

Fang et al., "Long Germanium Nanowires Prepared by Electrochemical Etching", Nano Letters, 2006, vol. 6, No. 7, 1578-1580.

Forouhi et al., "Optical dispersion relations for amorphous semiconductors and amorphous dielectrics", Physical Review B, vol. 34, No. 10, 1986, 7018-7026.

Fulop et al., "High-efficiency electrodeposited cadmium telluride solar cells", Appl. Phys. Lett., 1982, 40, 327-328.

Garnett et al., "Silicon Nanowire Radial p-n Junction Solar Cells", JACS, 130, 9224-9225, published on line Jun. 25, 2008.

Garnett et al., "Light Trapping in Silicon Nanowire Solar Cells", Nano Letters, 2010, 10:1082-1087.

Ghebrebrhan et al., "Global optimization of silicon photovoltaic cell front coatings", Optics Express, Apr. 22, 2009.

Gibbons et al., "A 14% efficient nonaqueous semiconductor/liquid junction solar cell", Appl. Phys. Lett., 1984, 45, 1095-1097.

Givargizov, "Growth of Whiskers from the Vapor Phase", Highly Anisotropic Crystals, D. Reidel, Dordrecht, Holland, 1987, p. 169.

Goodey et al., "Silicon Nanowire Array Photoelectrochemical Cells", J. Am. Chem. Soc., 2007, 129 (41), 12344-12345.

Goto et al., "Molecular Nanojet in Water", Applied Phys. Express, 2 (2009) 035004-1-035004-2.

Goto et al., "Growth of Core-Shell InP Nanowires for Photovoltaic Application by Selective-Area Metal Organic Vapor Phase Epitaxy", Applied Physics Express 2 (2009) 035004-1-035004-3.

Gowrishankar et al., "Fabrication of densely packed, well-ordered, high-aspect-ratio silicon nanopillars over large areas using block copolymer lithography", Thin Solid Films, 2006, 513, 289-294.

Green, MA, "Optical Properties of Silicon", pveducation.org, accessed Jan. 10, 2014.

Gronet et al., "n-Type silicon photoelectrochemistry in methanol: Design of a 10.1% efficient semiconductor/liquid junction solar cell", Proc. Natl. Acad. Sci. USA, vol. 80, pp. 1152-1156, Feb. 1983.

Gstrein et al., "Effects of Interfacial Energetics on the Effective Surface Recombination Velocity of Si/Liquid Contacts", J. Phys. Chem., B2002, 106, 2950-2961.

Gu et al., "Quantitative Measurement of the Electron and Hole Mobility-Lifetime Products in Semiconductor Nanowires", Nano Letters, 2006, vol. 6, No. 5, 948-952.

Gunawan et al., "Characteristics of vapor-liquid-solid grown silicon nanowire solar cells", Solar Energy Materials & Solar Cells, 93 (2009) 1388-1393.

Guo, L. Jay, "Nanoimprint Lithography: Methods and Material Requirements", Advanced Materials, 19, 495-513, 2007.

Guttler, G. et al., "Photovoltaic Effect of Gold in Silicon", J. Appl. Phys., 1969, 40:4994-4995.

Guttler, G. et al., "Impurity Photovoltaic Effect in Silicon", Energy Conversion, 1970, 10:51-55.

Haick et al., "Electrical Characteristics and Chemical Stability of Non-Oxidized, Methyl-Terminated Silicon Nanowires", J. Am. Chem. Soc., 2006, 128, 8990-8991.

Harris et al., "Semiconductors for Photoelectrolysis", Ann Rev. Mater. Sci., 1978, 8:99-134.

Haxel et al., "Rare Earth Elements—Critical Resources for High Technology", U.S. Geological Survey Fact Sheet, 087-02, 2002, p. 3.

(56) References Cited

OTHER PUBLICATIONS

Hochbaum et al., "Controlled Growth of Si Nanowire Arrays for Device Integration", Nano Letters, 2005, vol. 5, No. 3, 457-460.
Hopkins et al., "Impurity Effects in Silicon for High Efficiency Solar Cells", Journal of Crystal Growth 75 (1986) 67-79.
Hu et al., "Analysis of Optical Absorption in Silicon Nanowire Arrays for Photovoltaic Applications", Nano Letters, vol. 7, No. 11, Nov. 2007, 3249-3252.
Huang et al., "Microstructured silicon protector", Applied Physics Letters, 89, 033506.1-033506.3, 2006.
Huang et al., "Fabrication of Silicon Nanowire Arrays with Controlled Diameter, Length, and Density", Advanced Materials, 19, 744-748 (2007).
Huynh et al., "Hybrid Nanorod-Polymer Solar Cells", Science, 295, 2425 (2002).
Ismail et al., "Hydrogen Gas Production for Electronic-Grade Polycrystalline Silicon Growth", IEEE ICSE, 2002, 53-56.
Jacoboni et al., "A Review of Some Charge Transport Properties of Silicon", Solid State Electronics, 1977, vol. 20, 77-891.
Jenny et al., "Semiconducting Cadmium Telluride", Physical Review, vol. 96, No. 5, Dec. 1, 1954, 1190-1191.
Jung et al., "Aligned Carbon Nanotube-Polymer Hybrid Architectures for Diverse Flexible Electronic Applications", Nano Letters, 2006, vol. 6, No. 3, pp. 413-418.
Kang et al., "Hybrid solar cells with vertically aligned CdTe nanorods and a conjugated polymer", Applied Physics Letters, 86, Issue 11, 113101-1-113101-3 (2005).
Kang et al., "Well-aligned CdS nanorod/conjugated polymer solar cells", Solar Energy Materials & Solar Cells, 90 (2006) 166-174.
Kawano et al., "Fabrication and properties of ultrasmall Si wire arrays with circuits by vapor-liquid-solid growth", Sensors and Actuators, A 97-98 (2002) 709-715.
Kayes et al., "Comparison of the device physics principles of planar and radial p-n junction nanorod solar cells", Journal of Applied Physics, 2005, 97:114302.1-114302.11.
Kayes et al., "Radial PN Junction Nanorod Solar Cells: Device Physics Principles and Routes to Fabrication in Silicon", IEEE PVSC, 2005, pp. 55-58.
Kayes et al., "Synthesis and Characterization of Silicon Nanorod Arrays for Solar Cell Applications", IEEE WCPEC, 2006, 1, 221-224.
Kayes et al., "Growth of vertically aligned Si wire arrays over large areas (>1cm2) with Au and Cu Catalysts", Supplementary Material, App. Phys. Letter, 91, 103110 (2007).
Keevers et al., "Efficiency Improvements of Silicon Solar Cells by the Impurity Photovoltaic Effect", IEEE 1993, Photovoltaic Specialists Conference, 140-146.
Kelzenberg et al., "Photovoltaic Measurements in Single-Nanowire Silicon Solar Cells", Nano Letters, 2008, vol. 8, No. 2, pp. 710-714.
Kelzenberg et al., "Single-nanowire Si solar cells", 33rd IEEE Photovoltaic Specialists Conference, 2008, 1-6.
Kelzenberg et al., "Predicted efficiency of Si wire array solar cells," 34th IEEE Photovoltaic Specialists Conference, 2009, 001948-001953.
Kelzenberg et al., "Enhanced absorption and carrier collection in Si wire arrays for photovoltaic applications", Nature Materials, 2010, 9:239-244.
Kempa et al., "Single and Tandem Axial p-i-n Nanowire Photovoltaic Devices", Nano Letters, 2008, vol. 8, No. 10, 3456-3460.
Kim et al. "Photovoltaic Properties of Nano-particulate and Nanorod Array ZnO Electrodes for Dye-Sensitized Solar Cell", Bull. Korean Chem. Soc., vol. 27, No. 2, 295-298, Feb. 2006.
Kim et al., "Stretchable and Foldable Silicon Integrated Circuits", Science, 2008, 320, 507-511.
Kim, Min Soo, International Search Report and Written Opinion issued in PCT/US2010/058422, Korean Intellectual Property Office, Date of Mailing: Sep. 16, 2011.
Klein et al., "Electrochemcial Fabrications of Cadmium Chalcogenide Microdiode Arrays", Chem. Mater., 1993, 5, 902-904.

Kressin et al., "Synthesis of Stoichiometric Cadmium Selenide Films via Sequential Monolayer Electrodeposition", Chem. Mater., 1991, 3, 1015-1020.
Kupec et al., "Dispersion, Wave Propagation and Efficiency Analysis of Nanowire Solar Cells," Optical Express, 2009, 17:10399-10410.
Lauhon et al., "Epitaxial core-shell and core-multishell nanowire heterostructures", Nature, vol. 420, Nov. 7, 2002, pp. 57-61.
Law et al., "Semiconductor Nanowires and Nanotubes", Annu. Rev. Mater. Res., 2004, 34:83-122.
Law et al., "Nanowire dye-sensitized solar cells", Nat. Mater., 2005, 4, 455-459.
Lee et al., "Solvent Compatibility of Poly(dimethylsiloxane)-Based Microfluidic Devices", Anal. Chem., 2003, 75, 6544-6554.
Lepiller et al., "New Facets of CdTe Electrodeposition in Acidic Solutions with Higher Tellurium Concentrations", Journal of the Electrochemical Society, 151 (5) C348-C357, 2004.
Lin et al., Efficient photoinduced charge transfer in TiO2 nanorod/conjugated polymer hybrid materials, Nanotechnology, 17 (2006), 5781-5785.
Lindner, Nora, International Preliminary Report on Patentability issued in PCT/US2010/058422, The International Bureau of WIPO, Date of Mailing: Jun. 14, 2012.
Lombardi et al., "Synthesis of High Density, Size-Controlled Si Nanowire Arrays via Porous Anodic Alamina Mask", Chem. Mater., 2006, 18, 988-991.
Lopatiuk-Tirpak et al., "Studies of minority carrier transport in ZnO", Superlattices and Microstructures, 42 (2007), 201-205.
Maiolo et al., "High Aspect Ratio Silicon Wire Array Photoelectrochemical Cells", J. Am. Chem. Soc., 129, 2007, 12346-12347.
Maiolo et al., "Macroporous Silicon as a Model for Silicon Wire Array Solar Cells", J. Phys. Chem. C 2008, 112, 6194-6201.
Marion et al., "Validation of a photovoltaic module energy ratings procedure at NREL", NREL Technical Report, 1999, NEL/TP-520-26909 1-48.
Marion et al., "Validation of a photovoltaic module energy ratings procedure at NREL", NREL Technical Report, 1999, NREL/TP-520-26909 49-97.
Martensson et al., "Fabrication of individually seeded nanowire arrays by vapour-liquid-solid growth", Nanotechnology, 14 (2003) 1255-1258.
McCandless et al., "Cadmium Telluride Solar Cells", In Handbook of Photovoltaic Science and Engineering, 2003, pp. 617-657.
McDonald et al., "Poly(dimethylsiloxane) as a Material for Fabricating Microfluidic Devices", Acc. Chem. Res., 2002, 35 (7), 491-499.
Meissner et al., "Light-Induced Generation of Hydrogen at CdS-Monograin Membranes", Chemical Physics Letters, vol. 96, No. 1, Mar. 25, 1983, pp. 34-37.
Min et al., "Semiconductor Nanowires Surrounded by Cylindrical Al2O3 shells", Journal of Electronic Materials, 2003, 1344-1348.
Mohan et al., "Controlled growth of highly uniform, axial/radial direction-defined, individually addressable InP nanowire arrays", Nanotechnology 16 (2005) 2903-2907.
Morales et al., "A Laser Ablation Method for the Synthesis of Crystalline Semiconductor Nanowires", Science, 79, 208-211 (1998).
Morin et al., "Biomimetic Assembly of Zinc Oxide Nanorods onto Flexible Polymers", J. Am. Chem. Soc., 2007, 129 (45), 13776-13777.
Muskens et al., "Design of Light Scattering in Nanowire Materials for Photovoltaic Applications", Nano Letters, 2008, vol. 8, No. 9, 2638-2642.
Oh, JE UK, Search Report and Written Opinion issued in PCT/US2010/058314, Korean Intellectual Property Office, Date of Mailing: Aug. 12, 2011.
Oh, JE UK, Search Report and Written Opinion issued in PCT/US2011/029663, Korean Intellectual Property Office, Date of Mailing: Jan. 10, 2012.
Park, Jae Hun, Search Report for PCT/US2008/070495, Korean Intellectual Property Office, Date of Mailing: Feb. 20, 2009.

(56) References Cited

OTHER PUBLICATIONS

Park, Jae Hun, Written Opinion for PCT/US2008/070495, Korean Intellectual Property Office, Date of Mailing: Feb. 20, 2009.
Park, Jae Hun, Search Report for PCT/US2008/070523, Korean Intellectual Property Office, Date of Mailing: Feb. 20, 2009.
Park, Jae Hun, Written Opinion for PCT/US2008/070523, Korean Intellectual Property Office, Date of Mailing: Feb. 20, 2009.
Park, Jae Hun, Search Report for PCT/US2008/070518, Korean Intellectual Property Office, Date of Mailing: Feb. 20, 2009.
Park, Jae Hun, Written Opinion for PCT/US2008/070518, Korean Intellectual Property Office, Date of Mailing: Feb. 20, 2009.
Paulson et al., "Spectroscopic ellipsometry investigation of optical and interface properties of CdTe films deposited on metal foils", Solar Energy Materials & Solar Cells, 82 (2004) 279-90.
Peng et al., "Fabrication of Large-Area Silicon Nanowire p-n Junction Diode Arrays", Adv. Mater., 2004, 16 (1), 73-76.
Peng et al., "Aligned Single-Crystalline Si Nanowire Arrays for Photovoltaic Applications", Small, 2005, 1, 1062-1067.
Plass et al., "Flexible Polymer-Embedded Si Wire Arrays", Advanced Materials, 21, 325-328, published online Nov. 14, 2008.
Pushparaj et al., "Flexible energy storage devices based on nanocomposite paper", PNAS, Aug. 21, 2007, vol. 104, No. 34, pp. 13574-13577.
Putnam et al., "Secondary Ion Mass Spectrometry of Vapor-Liquid-Solid Grown, Au-Catalyzed, SiWires", Nano Letters, 2008, vol. 8, No. 10, 3109-3113.
Putnam, M. et al., "10 m minority-carrier diffusion lengths in Si wires synthesized by Cu-catalyzed vapor-liquid-solid growth", Applied Physics Letters, 2009, 95:163116.1-163116-3.
Raravikar et al., "Embedded Carbon-Nanotube-Stiffened Polymer Surfaces", Small, 1 (3), 317 (2005).
Ray, Jayati, First Office Action, Australian Patent Office, Application No. 2008275878, Nov. 14, 2012.
Rosenbluth et al., "630-mV open circuit voltage, 12% efficient n-Si liquid junction", Appl. Phys. Lett, 1985, 45, 423-425.
Rosenbluth et al., "Kinetic Studies of Carrier Transport and Recombination at the n-Silicon/Methanol Interface", Journal of the American Chemical Society, vol. 108, No. 16, Aug. 6, 1986, pp. 4689-4695.
Rosenbluth et al., "'Ideal' Behavior of the Open Circuit Voltage of Semiconductor/Liquid Junctions", 1989, 93, 3735-3740.
Routkevitch et al., "Electrochemical Fabrication of CdS Nanowire Arrays in Porous Anodic Aluminum Oxide Templates", J. Phys. Chem. 1996, 100, 14037-14047.
Routkevitch et al., "Nonlithographic Nano-Wire Arrays: Fabrication, Physics, and Device Applications", IEEE Transactions on Electron Devices, vol. 43, No. 10, 1996, pp. 1646-1658.
Sah et al., "Recombination Properties of the Gold Acceptor Level in Silicon using the Impurity Photovoltaic Effect", Phys. Rev. Lett., 1967, 40:71-72.
Sansom et al., "Controlled partial embedding of carbon nanotubes within flexible transparent layers", Nanotechnology, 19, 035302 (2008).
Sayad et al., "Determination of diffusion length in photovoltaic crystalline silicon by modelisation of light beam induced current", Superlattices and Microstructures, 45 (2009), 393-401.
Schmidt et al., "Diameter-Dependent Growth Direction of Epitaxial Silicon Nanowires", Nano Letters, 2005, vol. 5, No. 5, 931-935.
Seibt et al.,"Characterization of haze-forming precipitates in silicon", J. Appl. Physics, 1988, 63:4444-4450.
Shchetinin et al., "Photoconverters Based on Silicon-Crystal Whiskers", Translated from Izmerital'naya Teknika, No. 4, pp. 35-36, 1978.
Shimizu et al., "Synthesis of Vertical High-Density Epitaxial Si(100) Nanowire Arrays on a Si(100) Substrate Using an Anodic Aluminum Oxide Template", Advanced Materials, 19, 917-920 (2007).
Shockley et al., "Detailed Balance Limit of Efficiency of p-n Junction Solar Cells", J. of Applied Physics, vol. 32, No. 3, 1961, 510-519.
Sivakov, V. et al., "Silicon Nanowire-Based Solar Cells on Glass: Synthesis, Optical Properties, and Cell Parameters", Nano Letters, 2009, vol. 9, No. 4, 1549-1554.
Spurgeon et al., "Repeated epitaxial growth and transfer of arrays of patterned, vertically aligned, crystalline Si wires from a single Si(111) substrate", Applied Physics Letters, 2008, 93:032112-1-032112-3.
Stelzner et al., "Silicon nanowire-based solar cells", Nanotechnology, 2008, 19:295203-1-295203-4.
Struthers, J.D., "Solubility and Difusivity of Gold, Iron, and Copper in Silicon", J. Appl. Phys, 27, 1956, p. 1560.
Sunden et al., "Microwave assisted patterning of vertically aligned carbon nanotubes onto polymer substrates", J. Vac. Sci. Technol. B 24(40 Jul./Aug. 2006, pp. 1947-1950.
Sze, M., "Physics of Semiconductor Devices", 2nd Edition, Wiley, New York, 1981, p. 21.
Takayama et al., "Topographical Micropatterning of Poly(dimethylsiloxane) Using Laminar Flows of Liquids in Capillaries", Advanced Materials, 2001, 13:570-574.
Thai, Luan C., Non-Final Office Action, U.S. Appl. No. 12/176,100, USPTO, Jan. 6, 2010.
Tian et al., "Coaxial silicon nanowires as solar cells and nanoelectronic power sources", Nature, 2007, 449:885-889.
Tiedje, T. et al., "Limiting efficiency of silicon solar cells", IEEE Transactions on Electron Devices, 1984, ED-31: 711-716.
Touskova et al., "Preparation and characterization of CdS/CdTe thin film solar cells", Thin Solid Films, 293 (1997) 272-276.
Tsakalakos et al., "Silicon nanowire solar cells", Applied Physics Letters, 91, 2007, 233117-1-233117-3.
Tsakalakos et al., "Strong broadband optical absorption in silicon nanowire films", J. of Nanophotonics, 2007, 1 , 013552-1-013552-10.
Wagner et al., "Vapor-Liquid-Solid Mechanism of Single Crystal Growth", Applied Physics Letters, Mar. 1, 1964, vol. 4, No. 5, pp. 89-90.

\* cited by examiner

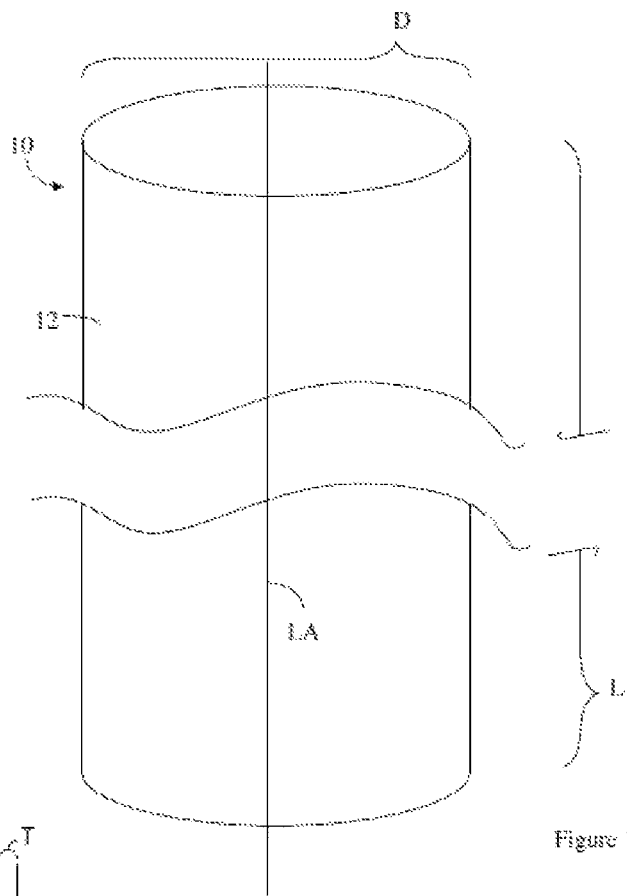
Figure 1
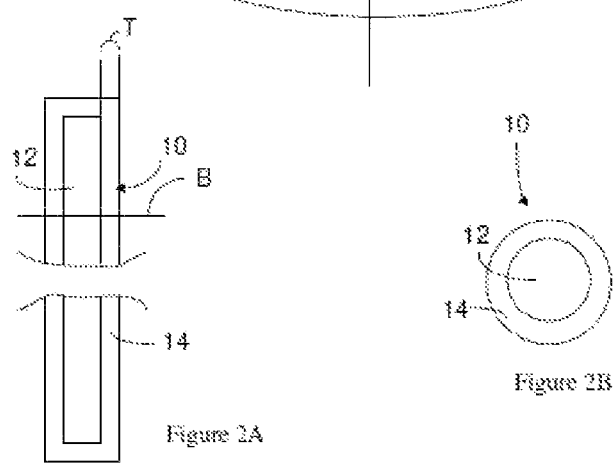
Figure 2A
Figure 2B

METHOD FOR ALIGNMENT OF MICROWIRES

CROSS REFERENCE TO RELATED APPLICATIONS

This application claims the benefit of U.S. Provisional Patent Application 61/756,381, filed on Jan. 24, 2013, the disclosure of which is incorporated herein in its entirety.

STATEMENT REGARDING FEDERALLY SPONSORED RESEARCH

This invention was made with government support under DE-SC0001293/T-105920 awarded by the Department of Energy. The government has certain rights in the invention.

FIELD OF THE INVENTION

The present invention relates to microwires and more particularly alignment of microwires.

BACKGROUND

Microwires are a class of long and narrow materials and can have lengths on the order of 100 microns and aspect ratios on the order of 10. These microwires are employed in a variety of different applications such as solar cells and solar fuels generators. These applications use arrays of microwires where the microwires are longitudinally aligned. These arrays are generally fabricated growing using the Vapor-Liquid-Solid (VLS) method of Chemical Vapor Deposition (CVD). However, this method is expensive and cannot be efficiently scaled for use in large-scale production. As a result, there is a need for a method of generating structures having longitudinally aligned microwires.

SUMMARY

A method of aligning microwires includes modifying the microwires so they are more responsive to a magnetic field. The method also includes using a magnetic field so as to magnetically align the microwires. In some instances, the method also include capturing the microwires in a solid support structure that retains the longitudinal alignment of the microwires when the magnetic field is not applied to the microwires.

Modifying the microwires can include forming a coating on the microwires. The coating can include or consist of a magnetically responsive material that produces its own magnetic field or that can be made to produce its own magnetic field. Examples of magnetically responsive materials include ferromagnetic materials. All or a portion of the coating can optionally be removed from the microwires after the longitudinal alignment of the microwires. In some instances, at least a portion of the coating is removed after the microwires are captured in the solid support.

BRIEF DESCRIPTION OF THE FIGURES

FIG. 1 is a cross section of a microwire.

FIG. 2A is a cross section of a coated microwire taken along the longitudinal axis of the microwire.

FIG. 2B is a cross section of the microwire shown in FIG. 2A taken along the line labeled B in FIG. 2A.

FIG. 6A is the system of FIG. 5B with the body of the microwire doped so as to be an n-type material or as a p-type material.

FIG. 6B illustrates the system of FIG. 6A after removal of the exposed magnetically responsive material.

FIG. 6C illustrates the system of FIG. 6B after formation of a dopant barrier on the exposed portion of the microwires and after a portion of the dopant barrier is masked.

FIG. 6D illustrates the system of FIG. 6C after the exposed portion of the dopant barrier is removed. Additionally, the mask is removed after removal of the exposed portion of the dopant barrier.

FIG. 6E illustrates the system of FIG. 6D after formation of a doped region in each of the microwires. The doped region is formed so as to define a cladding and a core in each of the microwires. The doped region is formed such that a pn junction is formed at the interface of the cladding and core.

FIG. 6F illustrates the system of FIG. 6E after formation of a transparent and electrically conductive material on the microwires.

FIG. 6G illustrates the system of FIG. 6F after removal of a substrate and an alignment structure.

DESCRIPTION

Figure 3A:
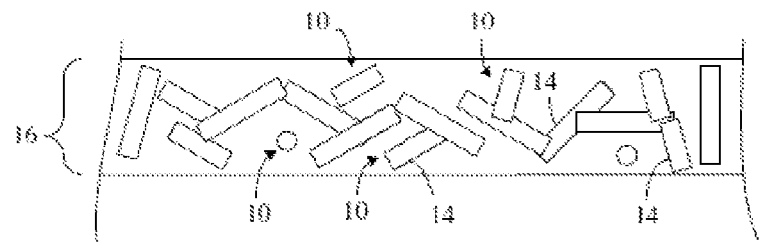
FIG. 3A is a cross section of a system having an alignment liquid on a substrate. The alignment liquid includes microwires that are randomly aligned in a liquid.

As used herein and in the appended claims, the singular forms "a," "and," and "the" include plural referents unless the context clearly dictates otherwise. Thus, for example, reference to "a magnetic field" includes a plurality of such magnetic fields and reference to "the substrate" includes reference to one or more substrates, and so forth.

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Any publications discussed above and throughout the text are provided solely for their disclosure prior to the filing date of the present application. Nothing herein is to be construed as an admission that the inventors are not entitled to antedate such disclosure by virtue of prior disclosure.

Devices having longitudinally aligned microwires are produced from microwires that are physically independent of one another. The microwires are then modified so they have an increased responsivity to a magnetic field. The magnetic field is then used to longitudinally align the microwires. The longitudinally aligned microwires are then immobilized in a support structure that retains the longitudinal alignment. As a result, a device that includes the aligned microwires can be incorporated into devices such as solar cells and solar fuels generators.

Before the magnetic alignment of the microwires, the microwires need not be aligned with one another or even physically attached to one another or a common substrate. In fact, the microwires can have random orientations. This allows a variety of microwire fabrication processes to be employed. Many of these processes can generate microwires with controllable lengths and/or diameters but without any particular orientation or alignment. Colloidal methods such as ligand-assisted solution-liquid-solution (SLS) growth processes are just one example of such a process. These processes are both affordable and scalable to the desired production level. As a result, the magnetic alignment of the microwires makes it possible to move microwire devices from the laboratory into the marketplace.

A cross section of a microwire 10 is illustrated in FIG. 1. The cross section is taken along the longitudinal axis of the microwire 10. The microwire 10 has a length labeled L and a generally circular cross section with a diameter (or width) labeled D. In cases where the value of D changes along the length of the microwire 10, D refers to the averaged diameter or width. An aspect ratio for the microwire 10 is a ratio of the L: D. Microwires 10 typically have diameters (or widths) greater than 0.1 µm, 0.5 µm, or 1 µm and/or less than 10 µm, 100 µm, or 500 µm. Additionally or alternately, microwires 10 typically have aspect ratios greater than 1, 10, 30, or 50 and/or less than 150, or 100 . Suitable materials for the body 12 of microwire 10 include, but are not limited to, semiconductors and other materials onto which a magnetically responsive material can be coated. The microwires 10 can be include or consist of an n-type material or a p-type material. Additionally or alternately, the microwires 10 can include one or more regions that are n-type materials and one or more regions that are p-type materials. The different regions can be located such that one or more pn junctions are formed in the microwire 10. In some instances, the n-type materials and/or the p-type materials are formed by doping a semiconductor. In one example, the bodies of the microwires 10 are p-type silicon.

The microwires 10 also have a longitudinal axis labeled LA in FIG. 1. The longitudinal axis is a line that extends through the center of each end of the microwire 10. In many microwire 10 applications, it is desirable for groups or arrays of microwires 10 to have their longitudinal axes aligned or substantially aligned in that they are parallel to one another or are substantially parallel to one another.

A method of forming a device having longitudinally aligned microwires 10 can include generating the microwires 10 such that they are physically independent from one another. For instance, the microwires 10 can be generated such they are not mechanically attached to one another or to a common object such as a substrate. As a result, the microwires 10 can be grown using any number of methods that permit reasonable control of the diameter and length of the microwires 10 but produces unaligned microwires 10 or even randomly aligned microwires 10. Examples of these methods include colloidal methods. For instance, the microwires 10 can be grown in solution using methods such as ligand-assisted solution-liquid-solution (SLS) growth processes. These methods result in a solution of microwires 10 that are not longitudinally aligned and can be classified as randomly oriented. Additionally, these processes allow for the diameter (or width) and length of the microwires 10 to be controlled or substantially controlled.

After obtaining the microwires 10 from a supplier and/or by fabrication, the microwires 10 are generally not substantially responsive to magnetic fields; however, the responsivity of the microwires 10 to a magnetic field can be increased. For instance, the microwires 10 can be physically or mechanically modified so they are more responsive to a magnetic field than they were previous to the modification. One method of modification is to add a magnetically responsive material to the body 12 of the microwires 10. Suitable magnetically responsive materials are materials that produce their own magnetic field or can be made to produce their own magnetic field. For instance, ferromagnetic materials such as nickel and cobalt can produce their own magnetic field. In some instances, ferromagnetic materials do not produce their own magnetic field but can be made to produce their own magnetic field by exposing the material to another magnetic field as a result of magnetic domains being rearranged in the material (i.e., the process of magnetization). The microwires 10 can be modified so as to include these ferromagnetic materials. In one example, the microwires 10 can be coated with a material that includes or consists of one or more ferromagnetic materials. The result is a microwire 10 having a coating 14 that includes or consists of one or more magnetically responsive materials as illustrated in FIG. 2A and FIG. 2B. FIG. 2A is a cross section of a coated microwire 10 taken along the longitudinal axis of the microwire 10. FIG. 2B is a cross section of the microwire 10 shown in FIG. 2A taken along the line labeled B in FIG. 2A. The coating 14 has a thickness labeled T in FIG. 2A. Although the coating 14 is illustrated as being continuous, the coating 14 need not be continuous and can be localized at one or more locations on each of the microwires 10. Suitable methods for coating a ferromagnetic material onto the microwires 10 include, but are not limited to, electroplating, electroless deposition, evaporation, and sputtering. As a result, the coating includes or consists of one or more ferromagnetic components. For instance, in some instances, the coating includes or consists of one or more components selected from the group consisting of nickel and cobalt, and alloys that include one or more components selected from the group consisting of nickel and cobalt. An example of a suitable alloy that includes nickel is a nickel-molybdenum alloy.

The modified microwires 10 are placed in a liquid so as to form an alignment liquid 16. The alignment liquid 16 can include the modified microwires 10 as a suspension or as a colloid. The modified microwires 10 are not longitudinally aligned in the alignment liquid 16. The alignment liquid 16 can be placed on a substrate 18 as shown in FIG. 3A. The longitudinal axes of the microwires 10 are not aligned. In some instances, the longitudinal axes of the microwires 10 are arranged randomly or substantially randomly. Suitable substrates 18 include, but are not limited to, silicon substrates, chemically modified silicon, silicon with an oxide layer, glass, and solid polymers. Suitable methods for placing the alignment liquid 16 on the substrate 18 include, but are not limited to, drop casting, spin coating, and dip coating.

Figure 3B:
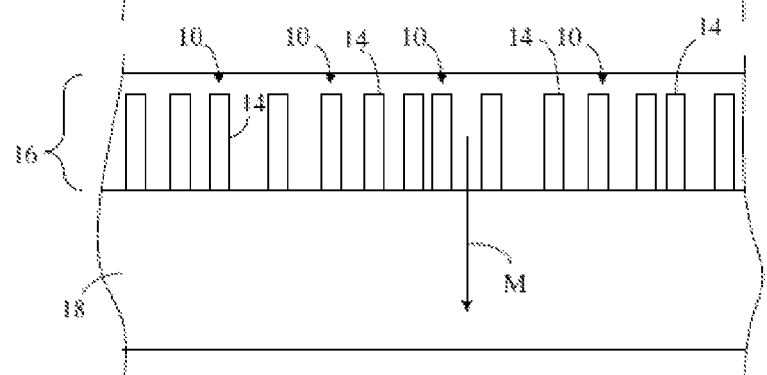
FIG. 3B is a cross section of a system having an alignment liquid on a substrate. The alignment liquid includes microwires in a liquid. The system is exposed to a magnetic field such that the microwires align with the direction of the magnetic field.

The substrate 18 and alignment liquid can then be exposed to a magnetic field such that the microwires 10 become longitudinally aligned in the magnetic field as illustrated in FIG. 3B. The direction of the magnetic field is labeled M in FIG. 3B. The magnetic field has sufficient strength to cause the microwires 10 to re-arrange themselves within the alignment liquid. The alignment is such that longitudinal axes of the microwires 10 become parallel or substantially parallel with the direction of the magnetic field. Additionally, when a permanent magnet is used as the source of the magnetic field, the permanent magnetic is arranged such that the magnetic field pulls the lower end of the microwires 10 into contact with the substrate 18 and accordingly results in a monolayer of the microwires. Alternately, the alignment can be performed using magnetic field sources where there is little or no upward or downward force such as occurs in the center of an electromagnetic coil. In these instances, a monolayer can be achieved as a result of one end of the microwires maintaining van der Waals attraction with the substrate during the process of aligning the microwires.

As will be discussed in more detail below, the longitudinal alignment is not only a function of the strength of the magnetic field but is also a function of the modification of the microwires 10 and/or dimensions of the microwire 10. For instance, when the microwires 10 include a coating 14 of a magnetically responsive material on the body 12 microwires 10, a thicker coating 14 increases the percentage of microwires 10 that become longitudinally aligned until a peak percentage of alignment is achieved. Additionally, lower magnetic field strength is needed to align longer microwires 10. As will be shown in the below examples, the selection of the substrate 18 and alignment liquid can also play a role in determining the magnetic field strength that is needed to provide the desired degree of alignment. For instance, the required magnetic field strength can be reduced when the substrate has a low surface energy (i.e., is "hydrophobic/oleophobic") and wire has a high surface energy (i.e., is "hydrophilic") as modulated by the addition of the liquid in the alignment liquid. Alternately, the required magnetic field strength can be reduced when the substrate has a high surface energy (i.e., is "hydrophilic") and the wire has a low surface energy (i.e., is "hydrophobic/oleophobic") as modulated by the addition of the liquid in the alignment liquid.

The required magnetic filed is reduced because the attraction between the microwires and the substrate surface is reduced relative to situations where microwires surface and the substrate surface each have a low surface energy or each have a high surface energy. The desired surface energy can be achieved by modification of the surface of the coating and/or the substrate. For instance, when the coating includes or consists of nickel, the nickel can be derivatized with silanes to make it either hydrophobic or hydrophilic due to the native oxide often present on nickel. Alternately, elemental nickel could be modified with amino ligands to obtain the desired surface energy. The substrate surface can be similarly modified to achieve the desired surface energy level. For instance, when the substrate surface includes silicon, the substrate surface can be modified to be hydrophobic substrate by modifying the surface to include Si—H or the substrate surface can be modified so as to be hydrophilic by modifying the substrate surface to include Si—OH.

The variables of microwire 10 dimensions, microwire 10 modification, magnetic field, substrate 18 selection and selection of liquid for the alignment liquid 16 can be such that more than 70%, 85%, 90%, 96%, or 97% of the microwires 10 have a longitudinal axis that is within 15°, 10°, 5°, or 3.5° of the direction of the magnetic field. These degrees of alignment are achieved despite the microwires having lower degrees of alignment before application of the magnetic field. In some instances, these degrees of alignment can be achieved when one, two, three or more than three factors are satisfied where the factors are selected from the group consisting of microwire length more than 10 μm, or 25 μm, and/or less than 100 μm, or 200 μm; magnetic field strength more than 25 G or 50 G and/or less than 200 G to 300 G in the case of an electromagnet or more than 200 G, or 500 G and/or less than 1500 G or 3000 G in the case of a permanent magnet; a coating thickness greater than 20 nm or 75 nm, and/or less than 250 nm or 400 nm.

Figure 3C:
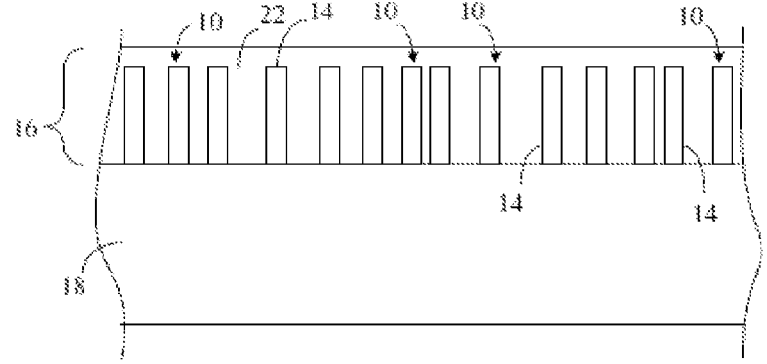
FIG. 3C illustrates the system of FIG. 3B after a polymer precursor in the alignment liquid is cured so as to form a support structure and the magnetic field is removed.

The aligned microwires 10 can be embedded in a solid support structure 22 that holds the microwires 10 in the longitudinally aligned orientation after the magnetic field and/or substrate 18 is removed. The support structure 22 can include or consist of polymers. In one example, the alignment liquid 16 includes or consists of a polymer precursor. In some instances, the alignment liquid 16 includes a solvent in addition to the polymer precursor. The polymer precursor can be cured to generate a device having aligned microwires 10 as shown in FIG. 3C. The magnetic field can optionally remain in place during the formation of the support structure 22. In these instances, the magnetic field pulls the microwires 10 against the surface of the substrate 18 during the formation of the support structure 22. As a result, the lower ends of the microwires 10 are coplanar or substantially coplanar in the device. The result is a device having longitudinal alignment and end alignment. Suitable solvents include, but are not limited to, organic solvents such as toluene, dichloromethane, and isopropanol. Suitable polymers include, but are not limited to, polydimethylsiloxane, PEDOT:PSS, copolymer of tetrafluoroethylene and perfluoro-3,6-dioxa-4-methyl-7-octene-sulfonic acid such as NAFION, wax, and poly(methyl methacrylate). Suitable methods for curing the polymer in the solvent include, but are not limited to, application of heat, passage of time, and/or UV curing. Suitable polymer precursors include the compounds needed to polymerize the polymer. For instance, the polymer precursor can include monomers or the components from which the monomers are generated. As an example, when the polymer is polydimethylsiloxane, the polymer precursor can include dimethyldichlorosilane which is the source of the [SiO(CH$_3$)$_2$] monomers in the polydimethylsiloxane. Additionally, the solvent can include water. When the polymer is cured, the dimethyldichlorosilane and water react to produce the polydimethylsiloxane and HCl.

Figure 3D:
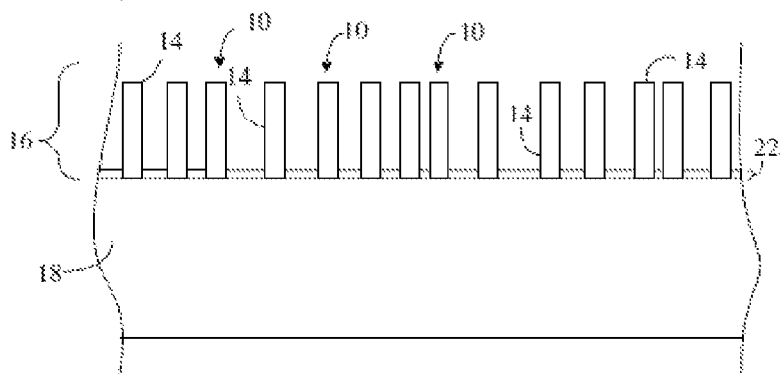
FIG. 3D illustrates the system of FIG. 3C after a polymer precursor in the alignment liquid is cured and the magnetic field is removed. The amount of polymer precursor in the alignment liquid is reduced so as to form a support structure and the magnetic field is removed. The support structure is formed such that only a portion of each microwire is partially embedded in the support structure.

Even though FIG. 3C illustrates the microwires 10 as encapsulated in the support structure 22, the microwires 10 can be only partially embedded in the support structure 22. For instance, the amount of polymer precursor in the alignment liquid 16 can be reduced such that when the polymer precursor is cured, the microwires 10 are only partially embedded in the polymer as illustrated in FIG. 3D. The magnetic field can optionally remain in place during the formation of the support structure 22. In these instances, the magnetic field pulls the microwires 10 against the surface of the substrate 18 during the formation of the support structure 22. As a result, the lower ends of the microwires 10 are coplanar or substantially coplanar in the device. All or a portion of the coating 14 can optionally be removed from body 12 of the microwires after formation of the support structure. The resulting device can be separated from the any remaining alignment liquid 16. Suitable methods for removing the remaining alignment liquid 16 include, but are not limited to, evaporation, pumping, and/or pipetting.

When the support structure 22 is in place, the substrate 18 can be removed from the device. A suitable method for removing the substrate 18 includes, but is not limited to, mechanical detachment techniques.

Figure 4A:
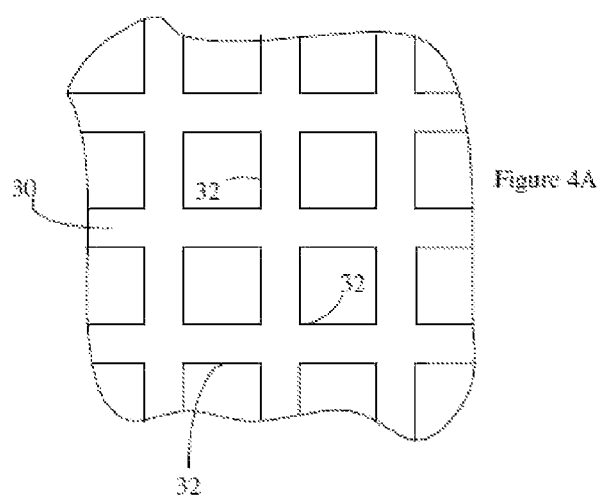
FIG. 4A is a topview of an alignment structure.

In the device of FIG. 3C and FIG. 3D, the lateral spacing between microwires 10 can be a result of the packing density on the substrate 18. However, a desired pattern of lateral spacing between the microwires 10 can also be achieved through the use of an alignment structure 30. FIG. 4A is topview of a portion of an alignment structure 30 having recesses 32 extending into an upper surface of the alignment structure 30. The recesses 32 are positioned in the pattern that is desired for the spacing of the microwires 10. For instance, the recesses 32 can be patterned in a periodic two-dimensional array. The recesses 32 can extend through the alignment structure 30 or part way into the alignment structure 30.

Figures 4B, 4C:
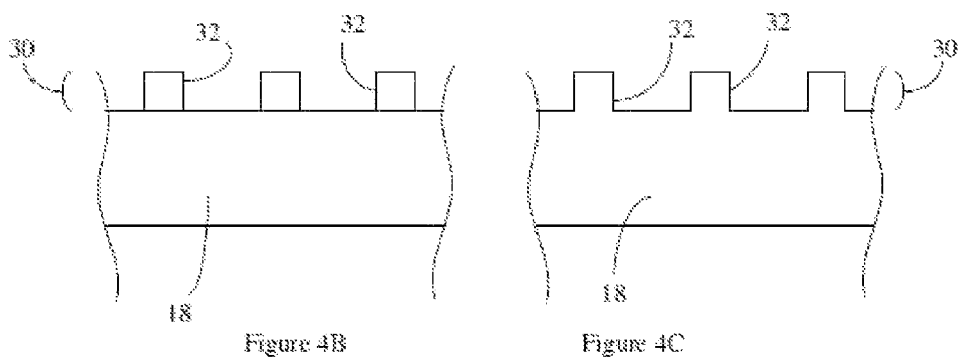
FIG. 4B is a cross section of a system having the alignment structure positioned on a substrate.
FIG. 4C illustrates the system of FIG. 4B but with the alignment structure integrated into the substrate.

FIG. 4B is a cross section of a system having the alignment structure 30 positioned on a substrate 18. The recesses 32 extend through the alignment structure 30. The alignment structure 30 is shown as being different from the substrate 18, however, the alignment structure 30 can be formed in the top of the substrate 18 as shown in FIG. 4C. As a result, the alignment structure 30 need not be a different component from the substrate 18. When the substrate 18 also serves as the alignment structure 30, the recesses 32 need not extend through the substrate 18 but can extend part way into the substrate 18. When the alignment structure 30 is separate from the substrate 18, suitable material for the alignment structure 30 include, but are not limited to, a photolithography patterned oxide mask.

Figure 5A:
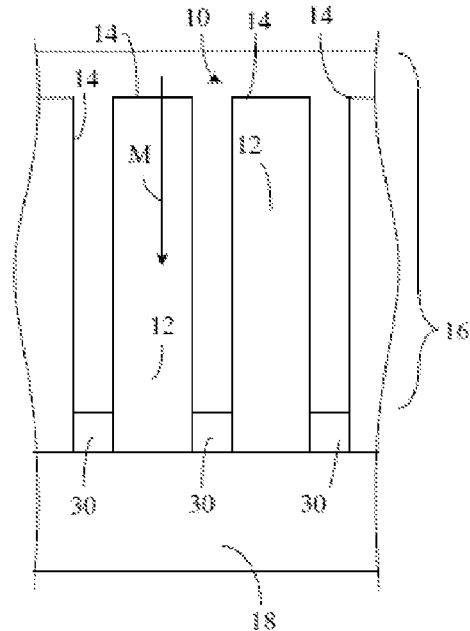
FIG. 5A is a cross section of a system having an alignment liquid positioned on the alignment structure of FIG. 4B and exposed to a magnetic field such that microwires in the alignment liquid align with the magnetic field.

FIG. 5A is a cross section of a system having an alignment liquid 16 positioned on the alignment structure 30 of FIG. 4B and exposed to a magnetic field. The direction of the magnetic field is labeled M in FIG. 5A. The magnetic field causes the microwires 10 to re-arrange themselves so they are longitudinally aligned. During the re-arrangement of the microwires 10 in the alignment liquid 16, the magnetic field pulls the lower end of each microwire 10 into one of the recesses 32 on the alignment structure 30. As a result, the microwires 10 are arranged on the alignment structure 30 in the same pattern that the recesses 32 are arranged on the alignment structure 30. Further, the magnetic field pulls the microwires 10 into contact with the bottom of the recess or with the substrate 18 below the recesses 32. As a result, the lower ends of the microwires 10 are coplanar or substantially coplanar in the device. The result is a device having longitudinal alignment, the desired lateral spacing, and end alignment. In order to achieve the above result, the recesses 32 are each sized to receive an end of a modified microwire 10 without being able to receive more than one microwire 10.

The recesses 32 can be sized such that the alignment structure 30 holds the microwires 10 in their longitudinally aligned arrangement when the magnetic field is removed. As a result, once the longitudinal alignment has been achieved, the resulting device can be separated from the remaining alignment liquid 16. Suitable methods for separating the device from the remaining alignment liquid 16 include, but are not limited to, evaporation, pumping, and/or pipetting. All or a portion of the coating 14 can optionally be removed from body 12 of the microwires using method such as wet etching.

Figure 5B:
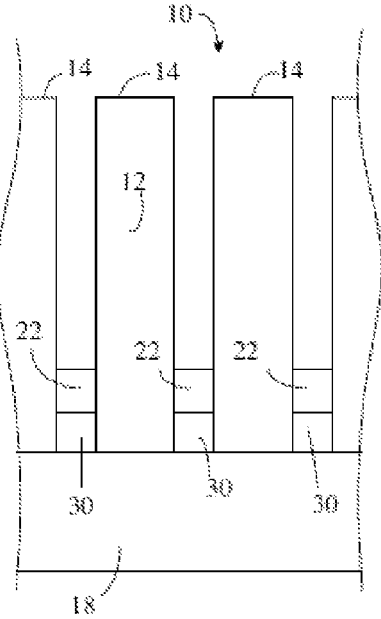
FIG. 5B is a cross section of the system shown in FIG. 5A after the magnetic field is removed and a support structure is formed.

After removing the alignment liquid 16, a support structure 22 can be formed on the device such that the microwires 10 are fully or partially embedded in the support structure 22. The support structure 22 can be configured to hold the microwires 10 in the longitudinally aligned orientation in the even that the alignment structure 30 and magnetic field are removed. The support structure 22 can include or consist of polymers. For instance, a polymer that acts as a support structure can be created by coating a liquid that includes or consists of a polymer precursor onto the exposed surface of the alignment structure 30 and then curing the polymer precursor. The result is a device having one end of the microwires 10 embedded in a cured polymer as shown in FIG. 5B. Although it is not illustrated in the cross section of FIG. 5B, the support structure 22 surrounds the microwires 10. Coating a thicker layer of the liquid for the support structure onto the exposed surface of the alignment structure 30 can result in a device where the microwires 10 are fully embedded in the support structure 22. Suitable methods of coating the liquid for the support structure onto the exposed surface of the alignment structure 30 include, but are not limited to, spin coating, dip coating, and drop casting. All or a portion of the coating 14 can optionally be removed from body 12 of the microwires after formation of the support structure.

When the support structure 22 is in place, the substrate 18 and/or alignment structure 30 can optionally be removed from the device. When the alignment structure 30 is separate from the substrate 18, it can often be re-used to generate other device. A suitable method for removing the substrate 18 includes, but is not limited to, mechanical detachment techniques. A suitable method for removing the alignment structure 30 includes, but is not limited to, mechanical detachment techniques.

When an alignment structure 30 is used, the alignment liquid 16 need not include a polymer precursor. As a result, the alignment liquid 16 can include or consist of readily available liquids such as water and/or one or more organic solvents such as isopropyl alcohol.

The above methods can produce devices with a packing density that matches the packing density that can be achieved with Vapor-Liquid-Solid (VLS) growth of the microwires 10 on a substrate 18. For instance, the devices can have a packing density higher than 4%, 10% or 15% of the area of the substrate surface within which the microwires are positioned being covered by microwires. Additionally, the ability of the above methods to concurrently align large numbers of microwires makes the methods suitable for large scale fabrication. For instance, the method can be scaled such that the number of microwires that can be concurrently aligned is a function of size of the magnet.

Devices having longitudinally aligned microwires 10 such as are shown in FIG. 3C, FIG. 4D and FIG. 5B have a variety of applications. FIG. 6A through FIG. 6G illustrate a method of converting the device of FIG. 5B to a solar cell. Before being modified to be more magnetically responsive, the microwires 10 can be doped using techniques such as diffusion or implantation. Accordingly, before the magnetically responsive material was added to the microwires 10 illustrated in FIG. 6A through FIG. 6G, the body 12 of the microwires 10 were doped so as to be an n-type material or a p-type material.

Figure 6A:
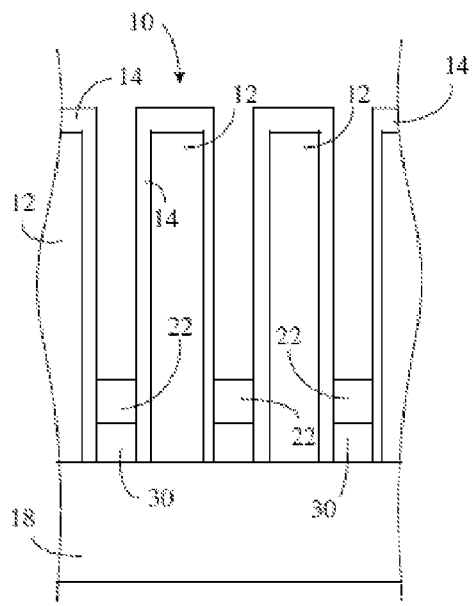
FIG. 6A-G illustrate a method of converting the device of FIG. 5B to a solar cell.
Figure 6B:
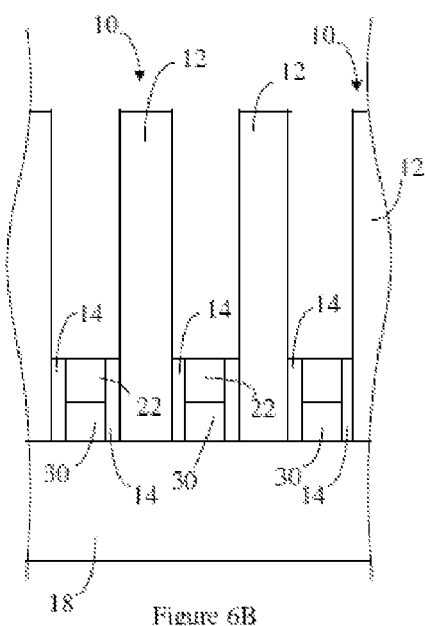

The magnetically responsive material is made more evident in the microwires 10 of FIG. 6A through FIG. 6G in order to simplify the following discussion. For instance, FIG. 6A illustrates the device of FIG. 5B with the magnetically responsive material made larger. The exposed magnetically responsive material is removed from the device of FIG. 6A so as to provide the device of FIG. 6B. Suitable techniques for removing the magnetically responsive material include techniques such as wet etching.

Figure 6C:
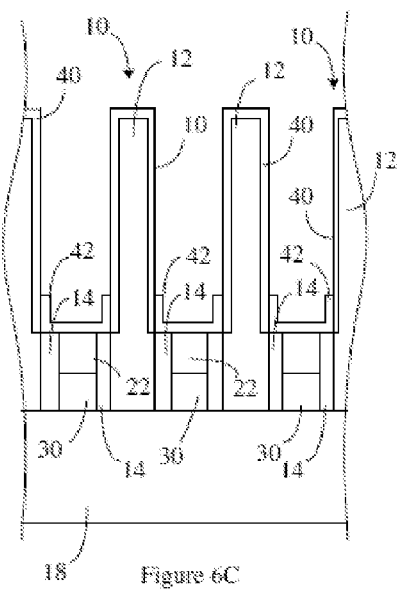

A dopant barrier 40 is formed on the exposed portions of the microwires 10 so as to provide the device of FIG. 6C. For instance, when the microwires 10 are made from a semiconductor such as silicon, a thermal oxidation can be performed so as to form a layer silicon dioxide at the exposed surface of the microwires 10. A mask 42 is formed on the device such that the mask 42 protects the portion of the dopant barrier 40 protecting the region of the microwires that should not receive dopant during a subsequent doping step. Suitable masks 42 include, but are not limited to, polydimethylsiloxane.

Figure 6D:
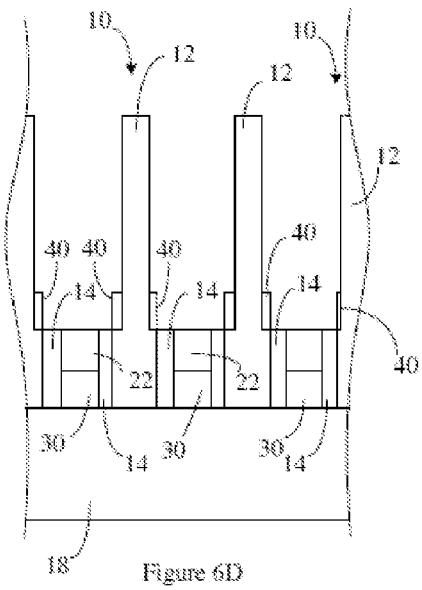
Figure 6E:
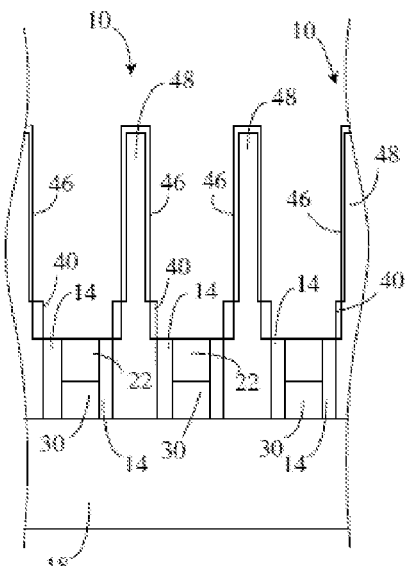

The exposed portion of the dopant barrier 40 and the mask 42 are removed so as to provide the device of FIG. 6D. Suitable methods for removing the dopant barrier 40 include, but are not limited to, wet etching. A doped region is formed on the device such that a cladding 46 and a core 48 are defined on each microwire 10 as shown in FIG. 6E. The doped region acts as the cladding 46. The cladding 46 can surround the core 48 for at least a portion of the length of the microwire 10. The core 48 and the cladding 46 are constructed such that one of them is a p-type material and the other is an n-type material. For instance, when the microwires 10 are a p-type material before formation of the cladding 46, the cladding 46 is formed as an n-type material leaving the core 48 as a p-type material. As a result, a pn junction is formed at the interface of the core 48 and cladding 46. Since the interface of the core 48 and cladding 46 runs longitudinally along the length of the microwire 10, the pn junction can run longitudinally along the length of the microwire 10 and can surround the center of the core 48. Suitable methods of forming the doped region that serves as the cladding 46 include, but are not limited to, diffusion doping, and implantation.

Figure 6F:
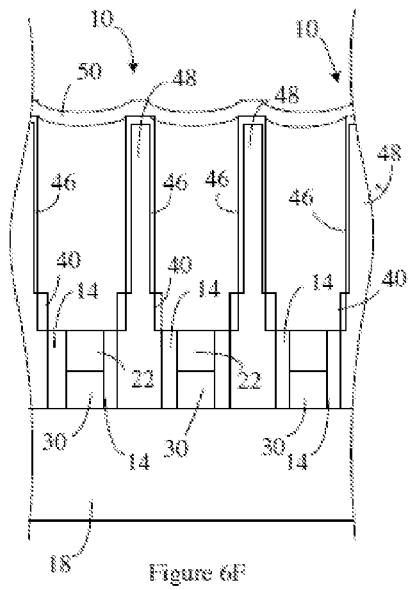

An electrically conducting layer 50 that is optically transparent or substantially transparent can be formed on the microwires 10 so as to provide the device shown in FIG. 6F. The claddings 46 of the microwires 10 are in direct physical contact with the electrically conducting layer 50. Accordingly, the claddings 46 are in electrical communication with electrically conducting layer 50. As a result, the electrically conducting layer 50 can serve as an electrical contact for the cell or can be in electrical communication with an electrical contact. An example of an optically transparent material that is suitable for use as an electrode includes, but is not limited to, fluorine tin oxide (FTC)) or fluorine doped tin oxide or indium doped tin oxide.

Figure 6G:
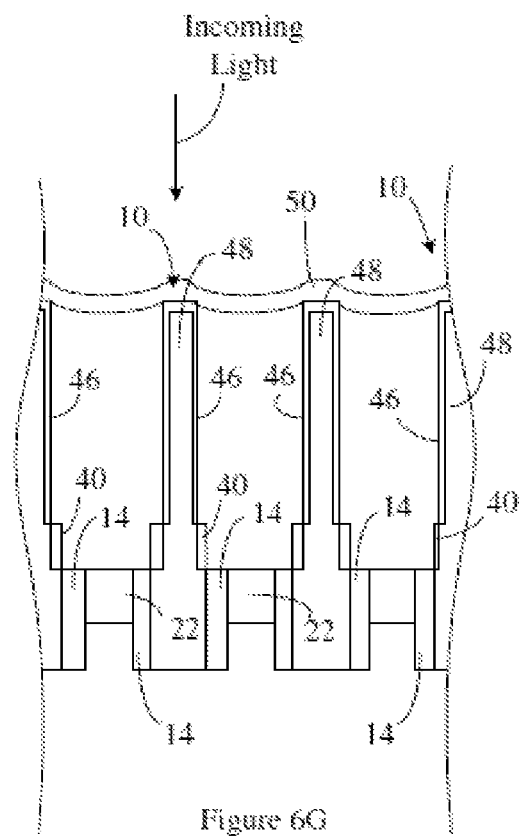

The substrate 18 and alignment structure 30 can be removed so as to provide the device in FIG. 6G. Suitable methods of removing the substrate 18 include, but are not limited to, mechanical detachment. Because the support layer is present on the device, the substrate 18 can optionally be removed at an earlier time in the method.

Additionally, the support structure 22 can also be electrically conducting. For instance, the support structure 22 can include or consist of an electrically conducting polymer or an "intrinsically conducting polymer." As is evident from FIG. 6G, the support structure 22 is in electrical communication with the core 48 through the magnetically responsive material. As a result, the support structure 22 can serve as an electrical contact for the cell or can be in electrical communication with an electrical contact. Suitable electrically conducting polymers for use in the support structure include, but are not limited to, poly(3, 4-ethylenedioxythiophene): poly(styrene sulfonate) (PEDOT:PSS).

During operation of the solar cell, light is incident on the microwires 10 and is absorbed in the microwires 10. The absorption of light generates carriers within the microwires 10. The light absorption increases as the longitudinal axes of the microwires 10 becomes substantially parallel with the direction of the incident light because the distance that the light travels through the microwires 10 is optimized. As a result, the ability of the above method to produce high degrees of longitudinally aligned microwires 10 provides a more efficient solar cell.

Although the method of FIG. 6A through FIG. 6G is shown using the device of FIG. 5B, the same process can be performed on the device of FIG. 3D in order to form a solar cell.

The following examples are provided to further illustrate the invention and are not meant to limit the embodiments set forth above or in the claims.

EXAMPLES

Example 1

Figure 7:
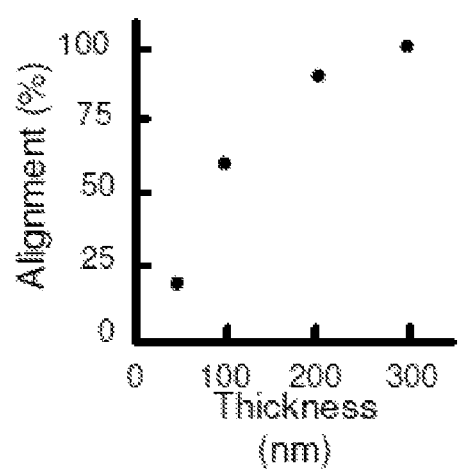
FIG. 7 is a graph of the percentage of longitudinally aligned microwires versus the thickness of a coating on the microwires for a particular level of magnetic field.

Batches of p-type silicon microwires having an average diameter of 1.5 µm and average aspect ratio of 50:1 were obtained. Different batches were modified with a nickel coating of different thickness. The nickel coating was applied by electroplating. The nickel coating thickness was varied from 20 nm to 300 nm. The different batches were each placed in a liquid of isopropanol so as to form an alignment solution. The alignment solutions were placed on a silicon substrate by drop casting and were exposed to a 2.5 kG magnetic field from a permanent magnet. The direction of the magnetic field was perpendicular relative to the surface of the substrate. The percentage of the microwires in each batch that aligned with the magnetic field was measured. A microwire was considered to be aligned with the magnetic field when a microscope showed the microwire to be perpendicular to the substrate. FIG. 7 is a plot of the thickness of the percentage of alignment versus the nickel coating thickness. The batches with a nickel coating thickness of 20 nm showed almost zero alignment while the batches with a nickel coating thickness of 300 nm showed almost nearly complete alignment. The plot illustrates that increasing the thickness of amount of the magnetically responsive material on the microwires increases the ability of the microwires to align with the magnetic field.

Example 2

Figure 8:
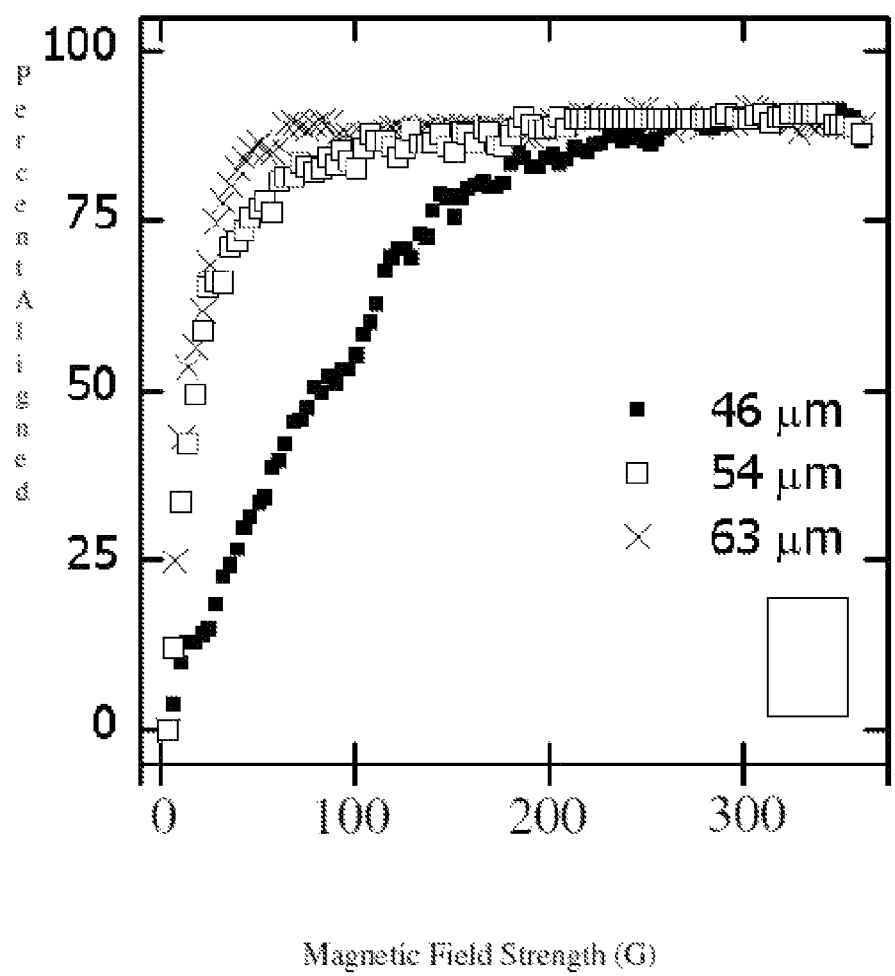
FIG. 8 is a graph of the percentage of longitudinally aligned microwires versus the magnetic field strength for microwires of different lengths.

Batches of p-type silicon microwires having an average diameter of 1.5 μm were obtained. Different batches had an average length of 46 μm, 54 μm, and 63 μm. The different batches were each modified with a 200 nm thick nickel coating by electroplating. The different batches were each placed in a liquid of isopropanol so as to form an alignment solution. The alignment solutions were placed on a silicon substrate by drop casting. The result was positioned in the center of a liquid cooled solenoid electromagnet and exposed to a magnetic fields that were swept from 0 G to 350 G at ~5 G/s. The percentage of the microwires in each batch that were considered aligned with the magnetic field was measured. FIG. 8 shows the percentage of alignment versus the magnetic field. This plot shows that the level of alignment is strongly dependent on the strength of the magnetic field. Additionally, this plot shows that longer microwires align more easily due to increased magnetic torque.

Example 3

Single-phase crystal silicon substrates were obtained. A portion of the substrate surfaces were made hydrophobic by a 2 min etch in buffered hydrofluoric acid. Another portion of the substrate surfaces were made hydrophilic by a 2 min etch in buffered hydrofluoric acid followed by a UV/ozone treatment for 30 min in a ProCleaner UV/ozone system.

Figure 9:
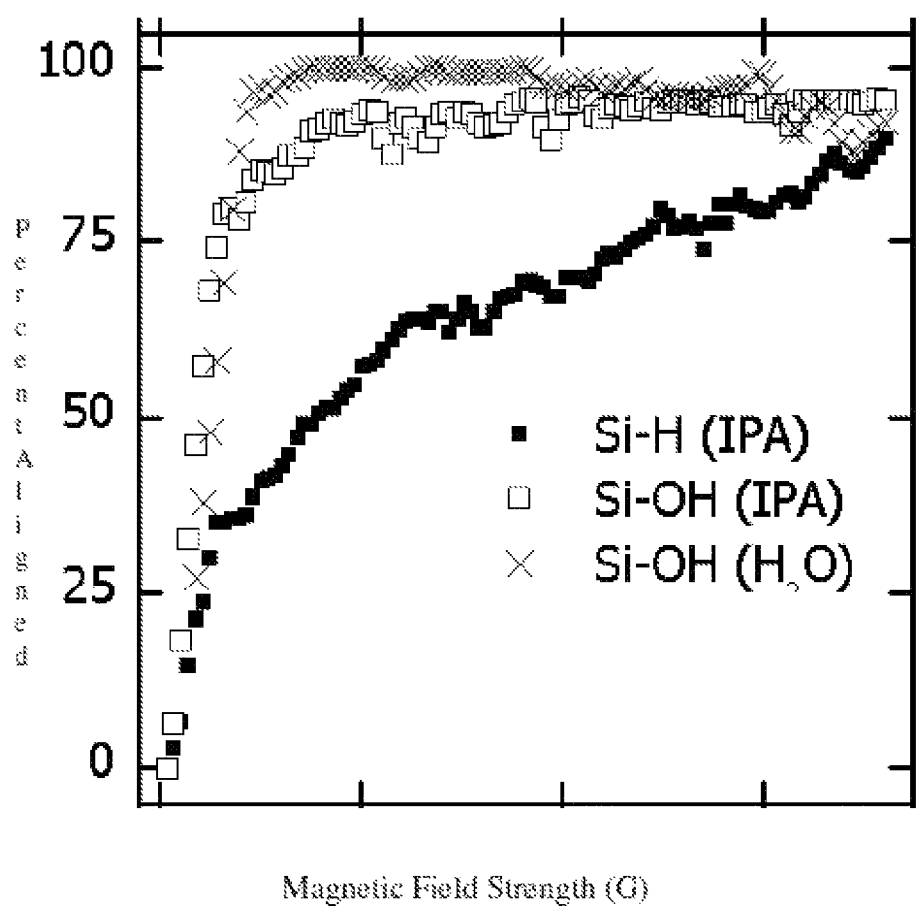
FIG. 9 is a graph of the percentage of longitudinally aligned microwires versus the magnetic field strength for microwires used in conjunction with a variety of substrate and liquid combinations.

Batches of silicon microwires having an average diameter of 1.5 μm were also obtained and were each modified with an 200 nm thick nickel coating by electroplating. A first one of the batches was placed in a liquid that included isopropyl alcohol so as to form a first alignment solution. The first alignment solution was placed on a hydrophobic substrate (Si—H). A second one of the batches was placed in a liquid that included isopropyl alcohol so as to form a second alignment solution. The second alignment solution was placed on a hydrophilic substrate (Si—OH). A third one of the batches was placed in a liquid that included water so as to form a third alignment solution. The third alignment solution was placed on a hydrophilic substrate (Si—OH). The results were positioned in the center of a liquid cooled solenoid electromagnet and exposed to a magnetic fields that were swept from 0 G to 350 G at ~5 G/s. The percentage of the microwires in each batch that were considered aligned with the magnetic field was measured. FIG. 9 shows the percentage of alignment versus the magnetic field.

Alignment of the Ni-coated Si microwires occurred at lower field strengths on hydrophilic Si substrates than on hydrophobic Si. These results may demonstrate the role of surface energy on the alignment of the microwires. For instance, the microwires aligned in isopropyl alcohol on the more hydrophilic (Si—OH) surface proved to be the most easily aligned. Even when the solvent was changed to water, the microwires aligned on the hydrophilic Si—OH surface in $H_2O$ also responded to a lower magnetic field strength than microwires aligned on the hydrophobic Si—H surface in isopropyl alcohol. Without being bound to theory, these results are believed to be due to a more favorable interaction with the solvent and a lessening of the hydrophobic attraction between the substrate and microwires.

Although many of the above images illustrate the microwires in a linear array, this is a result of illustrating cross sections of the microwires. Accordingly, the microwire arrays can be linear or two-dimensional.

Many of the above illustrations show the magnetic field having a direction that is being perpendicular to a surface of a substrate or other component. As a result, the microwires align with a direction that is perpendicular or substantially perpendicular to the surface of the substrate. Accordingly, these magnetic fields produce devices having the microwires aligned with the above degrees of alignment relative to a direction that is perpendicular to a surface of the substrate or a surface of a support structure. However, the magnetic field need not be perpendicular to a substrate. Since the above method aligns the microwires with the direction of the magnetic field, a non-perpendicular magnetic field will result in devices having the microwires aligned in a non-perpendicular direction relative to a surface of the substrate or a surface of a support structure. For instance, a 45° magnetic field with result in the microwires being aligned at about a 45° angle relative to a surface of the substrate or a surface of a support structure and can also result in the ends of the microwires being coplanar or substantially coplanar as discussed above.

Although the above method has been disclosed in the context of creating devices having longitudinally aligned microwires, the method can also be used for alignment of other structures having nonsocial and/or micro scale components. For instance, the above method can used to create device with longitudinally aligned components that can be modified so as to include a magnetically responsive material and that have an aspect ratio greater than 1. Examples of the components include, but are not limited to, plates or disk. Use of these methods can provide devices having components such as plates or disks that are aligned while standing on their edge.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method of forming a device, comprising:
   modifying silicon microwires so as to increase the responsivity of the silicon microwires to a magnetic field;
   using the magnetic field to longitudinally align the silicon microwires; and
   at least partially embedding the aligned silicon microwires in a polymer to maintain longitudinal alignment of the silicon microwires.

2. The method of claim 1, wherein using the magnetic field includes applying the magnetic field to the microwires such that more than 90% of the microwires each has a longitudinal axis that is within 7° of the direction of the magnetic field.

3. The method of claim 1, wherein the longitudinal axis of less than 90% of the microwires was within 7° of the direction of the magnetic field before using the magnetic field.

4. The method of claim 1, wherein modifying the microwires includes forming a coating of a material on a body of the microwire.

5. The method of claim 4, further comprising:
   removing at least a portion of the coating after using the magnetic field.

6. The method of claim 4, wherein the coating is more than 20 nm thick.

7. The method of claim 4, wherein coating includes a ferromagnetic material.

8. The method of claim 7, wherein forming the coating includes electroplating or sputtering the microwires with the ferromagnetic material.

9. The method of claim 8, wherein the ferromagnetic material includes at least one components selected from nickel and cobalt.

10. The method of claim 1, further comprising:
placing the microwires in a liquid so as to form an alignment liquid before using the magnetic field.

11. The method of claim 10, further comprising:
placing the alignment liquid on a substrate before using the magnetic field.

12. The method of claim 11, further comprising:
making a surface of the substrate hydrophilic before placing the placing the alignment liquid on the surface of the substrate.

13. The method of claim 11, wherein the electrical field is used such that ends of the aligned microwires are pulled into contact with the surface of the substrate.

14. The method of claim 11, wherein the alignment liquid is placed on a surface of the substrate such that less than 90% of the microwires was within 7° of the direction of the magnetic field before using the magnetic field.

15. The method of claim 14, wherein the magnetic field causes the microwires to re-arrange themselves in the alignment liquid such that more than 90% of the microwires have a longitudinal axis that is within 7° of the line that is perpendicular to the surface of the substrate.

16. The method of claim 1, further comprising:
capturing the longitudinally aligned microwires in a solid support that holds the microwires in a longitudinally aligned configuration when the magnetic field is not applied to the microwires.

17. The method of claim 16, wherein modifying the microwires includes forming a coating of a material on a body of the microwire, and further comprising:
removing at least a portion of the coating after capturing the longitudinally aligned microwires in the solid support.

18. The method of claim 1, wherein the microwires have a diameter that is less than 2 μm and an aspect ratio that is greater than 10.

* * * * *